United States Patent
Scollo et al.

(10) Patent No.: US 7,449,935 B2
(45) Date of Patent: Nov. 11, 2008

(54) DRIVEN CIRCUIT OF AN EMITTER SWITCHING CONFIGURATION TO CONTROL THE SATURATION LEVEL OF A POWER TRANSISTOR WHEN USED WITH HIGHLY VARIABLE COLLECTOR CURRENTS

(75) Inventors: Rosario Scollo, Misterbianco (IT);
Simone Buonomo, Augusta (IT);
Giovanni Vitale, Ragusa (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 192 days.

(21) Appl. No.: 11/066,610

(22) Filed: Feb. 25, 2005

(65) Prior Publication Data

US 2005/0194623 A1 Sep. 8, 2005

(51) Int. Cl.
*H03K 17/042* (2006.01)
(52) U.S. Cl. .................................. 327/374; 327/375
(58) Field of Classification Search ................ None
See application file for complete search history.

(56) References Cited

U.S. PATENT DOCUMENTS

| | | | | |
|---|---|---|---|---|
| 4,717,849 A | * | 1/1988 | Shigekane | 327/377 |
| 5,121,425 A | * | 6/1992 | Reichelt | 379/362 |
| 5,621,601 A | * | 4/1997 | Fujihira et al. | 361/93.9 |
| 6,072,676 A | * | 6/2000 | Tran et al. | 361/56 |
| 6,133,653 A | * | 10/2000 | Gaskins | 307/125 |
| 6,137,701 A | * | 10/2000 | Teissier et al. | 363/89 |
| 6,563,319 B1 | * | 5/2003 | Kraz | 324/458 |
| 2007/0129908 A1 | * | 6/2007 | Adam | 702/130 |
| 2007/0229044 A1 | * | 10/2007 | Visairo-Cruz et al. | 323/282 |

FOREIGN PATENT DOCUMENTS

EP    1 455 452    9/2004

* cited by examiner

*Primary Examiner*—Tuan T. Lam
*Assistant Examiner*—Hiep Nguyen
(74) *Attorney, Agent, or Firm*—Gardere Wynne Sewell LLP

(57) ABSTRACT

A drive circuit for an emitter switching configuration of transistors having a cascode connection of a power bipolar transistor and of a power MOS transistor control the saturation level of the configuration in applications which provide highly variable collector currents. The drive circuit includes a circuit operable to apply a varying voltage value to the control terminal of the bipolar transistor. A current/voltage converter senses a collector current flowing in the power bipolar transistor and controls conduction of a first transistor responsive thereto, the conduction of the first transistor controlling the conduction of a second transistor so as to vary the control terminal voltage in proportion to the sensed collector current of the power bipolar transistor.

26 Claims, 12 Drawing Sheets

Δ: 24.0μs
@: -15.8μs

C1 MAX
21.3 A

C4 MAX
402 V

C1 RISE 538ns
LOW RESOLUTION

—— CH1 IC
—— CH4 VCS
- - - CH3 IB

Δ: 16.24μs
@: 13.92μs

C1 MAX
8.6 A

C4 MAX
414 V

—— CH1 IC
—— CH2 VGS
- - - CH3 IB
- - - - CH4 VCS

Δ: 46.1μs
@: -29.7μs

C1 MAX
10.7 A

C4 MAX
402 V

C1 RISE 68ns
LOW SIGNAL
AMPLITUDE

——— CH1 IC
——— CH2 VGS
— — — CH3 IB
------- CH4 VCS

Δ: 6.34μs
@: 3.96μs

C1 MAX
9.8 A

C4 MAX
438 V

——— CH1 IC
——— CH2 VGS
— — — CH3 IB
------- CH4 VCS

Δ: 41.4μs
@: -8.6 μs

C1 MAX
15.2 A

C4 MAX
411 V

C1 RISE 157ns
LOW RESOLUTION

—— CH1 IC
—— CH2 VGS
– – CH3 IB
------ CH4 VCS

Δ: 6.34μs
@: 3.96μs

C1 MAX
17.0

C4 MAX
311 V

—— CH1 IC
—— CH2 VGS
– – CH3 IB
------ CH4 VCS

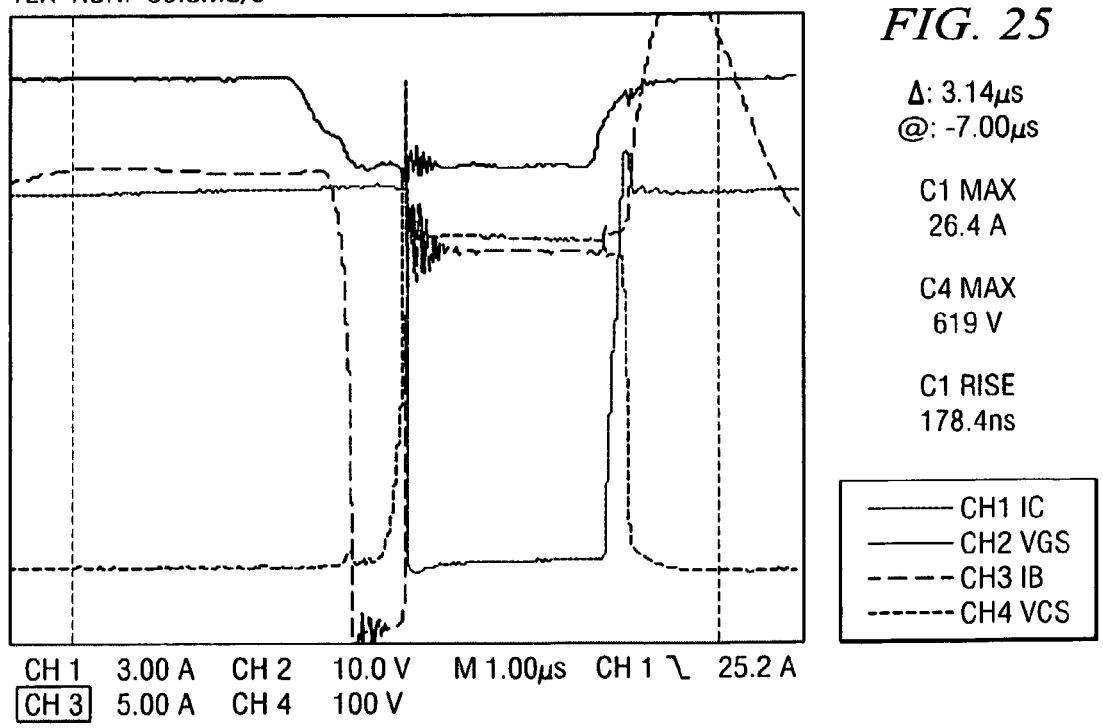

DRIVEN CIRCUIT OF AN EMITTER SWITCHING CONFIGURATION TO CONTROL THE SATURATION LEVEL OF A POWER TRANSISTOR WHEN USED WITH HIGHLY VARIABLE COLLECTOR CURRENTS

PRIORITY CLAIM

This application claims priority from Italian Application Patent No. MI2004A000356 filed Feb. 27, 2004, the disclosure of which is hereby incorporated by reference.

BACKGROUND OF THE INVENTION

1. Technical Field of the Invention

The present invention relates, in its more general aspect, to an emitter switching configuration, i.e., to a transistor configuration which comprises a cascode connection of a bipolar transistor having high breakdown voltage and a low voltage Power MOSFET. In particular, this invention relates to a driving circuit of an emitter switching configuration to control the saturation level in applications providing highly variable collector currents.

2. Description of Related Art

The emitter-switching configuration, consisting in the cascode connection of a power bipolar transistor, having high breakdown voltage, and a low voltage Power MOSFET, as shown in FIG. 1, has been known from the 1980's.

Nowadays, such configuration is made particularly interesting by the presence on the market of bipolar transistors having a squared RBSOA (in emitter-switching configuration) at a current being near the peak one and at a voltage equal to the BVCES, as well as of a Power MOSFET having a very low inner resistance $R_{DSON}$ and therefore being almost made like ideal switches.

The main advantages of the topology are, as it is well known, the very low voltage drop in conduction, typical of the bipolar transistors, and the turn-off speed. While turning off, in fact, the current output from the base is equal to the collector one, i.e., it is a very high current. This determines a drastic reduction both of the storage time and of the fall time, allowing the circuit to work also up to a frequency of 150 kHz.

Normally, the driving circuit also comprises an electrolytic capacitor and a zener diode parallel connected between a constant supply voltage reference and a resistance which connects such configuration in parallel with the control terminal of the bipolar transistor, as shown in FIG. 1.

The capacitor has the task of storing energy during the turn-off of the circuit for using it again during the subsequent turn-on and conduction of the power device; whereas the zener is a safety element for avoiding that the base voltage exceeds a determined value.

The driving operated by a circuit of this type is very useful and efficient in all those cases wherein the current on the device is void or very small with respect to the nominal one during the so-called turn-on.

FIG. 2 shows the wave forms which refer to a converter of the fly-back type which works at a frequency of 100 kHz and has a void turn-on current since the converter works in a discontinuous way.

When one is going to work with applications wherein the current value on the device at the turn-ON is not void, and at relatively high frequencies (>60 kHz), having to do with a bipolar transistor, the phenomenon of the $V_{CESAT}$ dynamics is highlighted. For this reason, with the driving circuit of FIG. 1, an excessive dissipation at the turn-on would be obtained due to the fact that the voltage drop $V_{CE}$ would take a relatively long time (>=2 μs) for reaching the saturation value.

With reference again to the circuit of FIG. 1, an increase of the $V_B$ would reduce only partially the problem of the $V_{CESAT}$ dynamics but it would worsen the turn-off performances to excess.

A suitable driving network for the applications with non void collector current at the turn-on has been subject of the European patent application no. 03425140.5, the disclosure of which is incorporated by reference, and is shown in FIG. 3.

The circuit structure of FIG. 3 suitably modulates the base current optimizing both switching steps and allowing the attainment of the lowest $V_{CESAT}$ value in the shortest possible time. FIG. 4 shows the wave forms which refer to a converter of the forward type which works at a frequency of 110 kHz, where the modulation of the base current can be observed.

The detailed operation and the sizing of the circuit of FIG. 3 are widely discussed in the cited patent application.

Although advantageous from several points of view, the driving circuit structured in the above schematically described way has known drawbacks mainly highlighted when the need of applications with collector currents having highly variable value is to be coped with.

In such applications, the circuit structure of the European patent application No. 03425140.5 must be sized taking into account the most stressful working condition, i.e., the highest collector current.

A correct saturation level should be thus ensured at the highest current value, by suitably choosing the $V_b'$ value, but, in so doing, for low collector current values, the device would work under over-saturation conditions, obtaining extremely long storage times.

This would imply an excessive dissipation at the turn-off, as well as a little accurate control due to the fact that the effective turn-off of the device would occur behind time with respect to the signal provided by the controller.

A need accordingly exists for devising a driving circuit of an emitter switching configuration to control the saturation level in applications which provide of highly variable collector currents, able to meet the above described need, i.e., that of having a base current proportional to the collector one so as to ensure a saturation level being suitable under each working condition, simultaneously overcoming, in a simple and effective way, all the drawbacks cited with reference to the prior art.

SUMMARY OF THE INVENTION

This problem is solved, according to embodiments of the present invention, by a driving circuit where, since the base current in conduction depends on the voltage $V_b'$ value, a base current proportional to the collector current is obtained by modulating the width of $V_b'$ according to the collector current.

In accordance with an embodiment of the invention, a driving circuit is provided for an emitter switching configuration of transistors to control a saturation level of the configuration in applications which provide highly variable collector currents. The transistor configuration comprises a cascode connection of a power bipolar transistor and a power MOS transistor. The driving circuit comprises a circuit mesh to transfer a predetermined voltage value to a control terminal of said power bipolar transistor starting from a supply voltage reference and with translation of level. A current/voltage converter is coupled to the power MOS transistor to supply a voltage to a control terminal of a first bipolar transistor coupled and active on an element of said circuit mesh to control variation of said predetermined voltage value of the proportional type with respect to collector current of the power bipolar transistor device.

In accordance with another embodiment of the invention, a circuit comprises a bipolar transistor having a base terminal receiving a control voltage. A power MOS transistor is connected to the bipolar transistor in cascode. A sensing circuit senses a current flowing along a conduction path of the bipolar transistor. A bias circuit is coupled to the sensing circuit and is operable to vary the control voltage of the bipolar transistor in proportion to the sensed conduction path current.

BRIEF DESCRIPTION OF THE DRAWINGS

A more complete understanding of the invention may be obtained by reference to the following Detailed Description and with reference to the accompanying drawings wherein:

FIG. 24 shows a diagram with storage times for a switching with high current value and proportional driving;

FIG. 25 shows a diagram with storage times for a switching with high current value and constant driving.

DETAILED DESCRIPTION OF THE DRAWINGS

Figure 5:
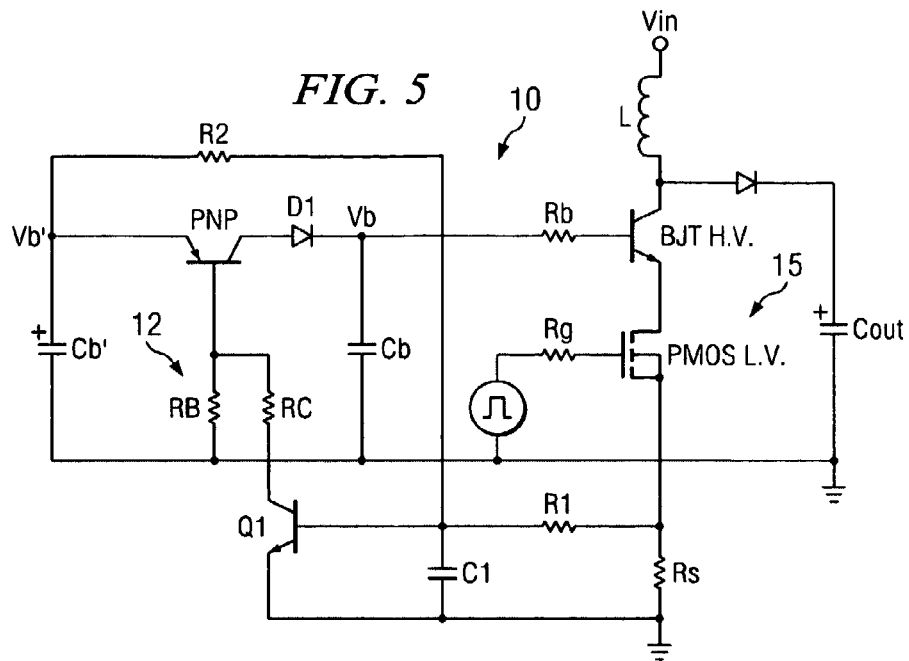
FIG. 5 shows a scheme of a driving circuit for emitter-switching according to an embodiment of the invention.

With reference to the figures, and in particular to the example of FIG. 5, the reference 10 globally and schematically indicates a driving circuit realized according to an embodiment of the present invention for an emitter switching configuration 15 to control the saturation level of the configuration itself in applications which provide highly variable collector currents.

FIG. 5 shows the driving circuit according to the invention for obtaining a relative insensitivity of the storage time when the collector current of the configuration 15 varies.

The configuration 15 of emitter switching transistors comprises a cascode connection of a bipolar transistor BJT, having high breakdown voltage, and a Power MOS of low voltage PMOS L.V.

Rs is a sensing resistance of very low value, connected in series to the MOS actuator of the configuration 15 and whose task is that of performing a reading of the current which flows on the power device during conduction. The current value is converted into a voltage which is transmitted to the base of the transistor Q1 by means of a low-pass filter comprising the resistances R1, R2 and the capacitor C1, wherein R1 and R2 are obviously used also to suitably bias the transistor Q1, and whereas a resistance RB is used to keep always on the transistor PNP inserted on a circuit mesh 12 which couples a supply voltage $V_b'$ with the control terminal of the bipolar transistor BJT.

$V_b'$ is a constant supply voltage whereas the voltage $V_b$ on node A of the circuit 10, coupled with the control terminal of the power transistor BJT, is translated in level.

The capacitors Cb' and Cb and the diode D1 of the circuit mesh 12 allow the circuit to obtain two distinct voltage levels useful to solve the problem of the $V_{CESAT}$ dynamics of the bipolar BJT.

The bipolar transistor Q1 is coupled with the bipolar transistor PNP of the mesh 12 by means of a resistance RC.

Finally, the coil L, the diode D2 and the capacitor Cout allow the circuit to simulate the behavior of a converter of the boost type.

The aim of the driving circuit 10 is that of obtaining a variation of $V_b$ of the proportional type with respect to the collector current of the power device BJT.

Let's suppose, for the moment, that the collector current is near zero. In this case the voltage drop on Rs is almost void.

Therefore the transistor Q1 is under the initial biasing condition set by means of the $V_b'$ value and of the R1 and R2 resistances. If we choose to bias the base with a voltage being a little lower with respect to the threshold value of the base-emitter junction, the transistor Q1 results to be off, thus the transistor PNP is biased only thanks to the resistance RB which makes a small outputting base current flow.

Let's now suppose that the collector current on the power device starts to grow. In this case, the voltage drop on Rs starts to grow and the value of the Q1 base voltage is thus increased, which determines a variation of the biasing point.

Now, a current proportional to the sensing current will flow on the resistance RC.

Such a current output from the base of the transistor PNP makes the $V_{CE}$ of this transistor decrease so that a higher voltage is transferred to the anode of D1, being $V_b'$ constant.

Let's now take into consideration the possible tolerances of the passive and active components which constitute the driving circuit according to an embodiment of the invention:

hfe spread of the transistor Q1 tolerance of the resistances R1 and R2 variation of the threshold voltage of the base-emitter junctions $V_b'$ ripple. As regards the ripple on $V_b'$, we can safely suppose a 5% highest percentage variation. Supposing a value of $V_b'$ of 4V, the highest possible ripple is of 0.2V.

By using resistances with tolerance equal to 1%, their variations can be considered as absolutely negligible.

The main problem is constituted by the hfe variation of the transistor Q1. Typical values are comprised between 100 and 250. It is thus evident that the sizing of the network is performed by taking into consideration the lowest gain value and its collector current would become too high, bringing prematurely the transistor PNP to saturation.

Figure 6:
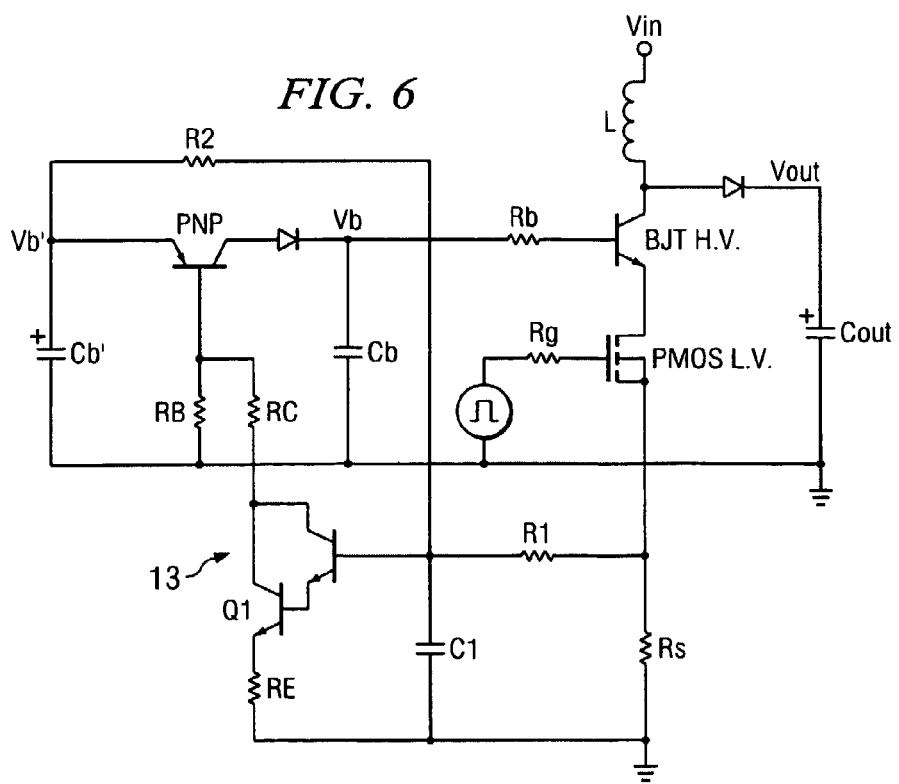
FIG. 6 shows a scheme of a complete driving circuit according to an embodiment of the invention.

Such problem is solved by replacing the single transistor Q1 with a DARLINGTON 13 and by performing a feedback through the introduction of an emitter resistance Re towards a potential reference, as shown in FIG. 6. In this way, the biasing point is fixed independently from the hfe value of the device resulting, therefore, in the device being insensitive with respect to the hfe spreads. FIG. 6 shows a more complete circuit which takes into account the previously exposed considerations.

Figure 4:
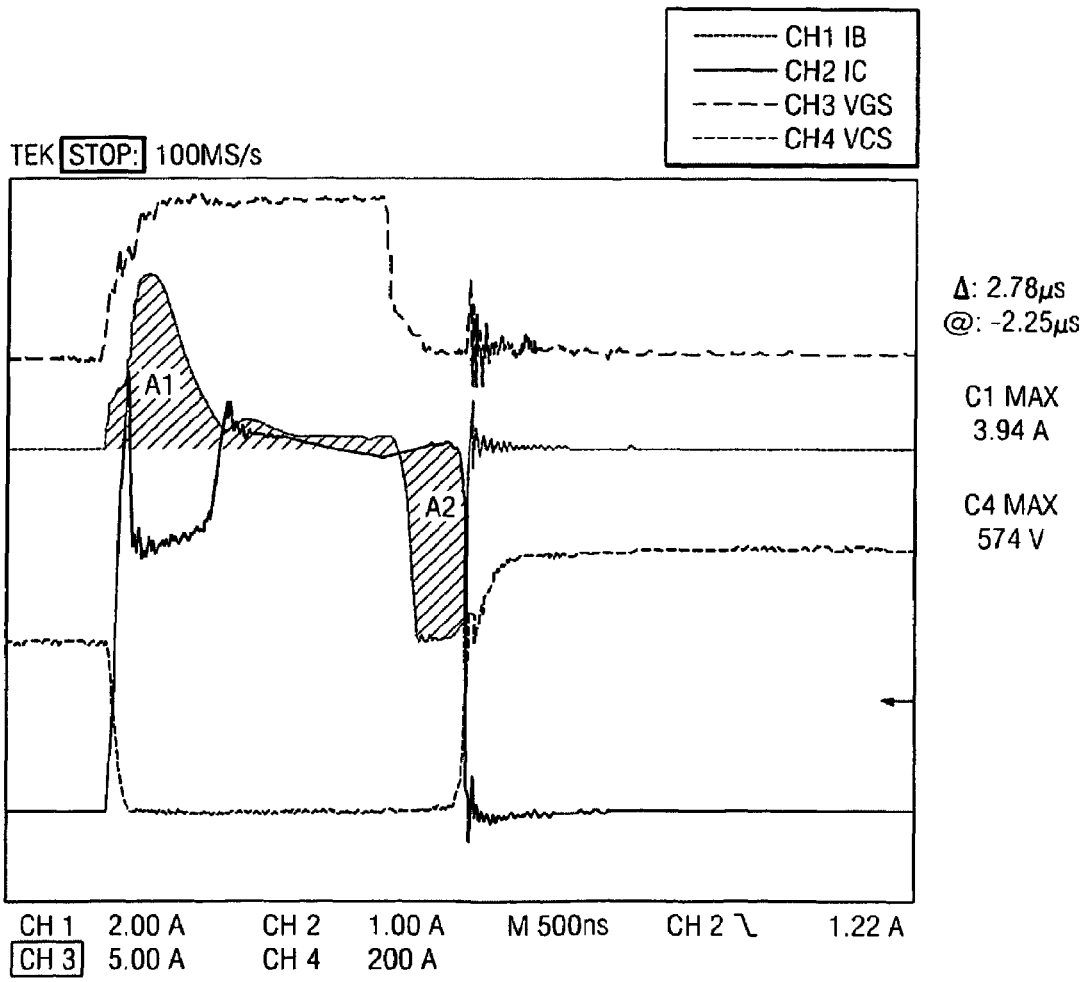
FIG. 4 shows a diagram with wave forms obtained with the driving circuit of FIG. 3.

Before showing in detail the sizing of the driving circuit 10 we take into consideration also the design specifications. In fact, having to drive the power bipolar transistor BJT H.V. in the configuration 15, the base current needs to have the trend shown in FIG. 4, where the peak during the turn-on must have a value being higher than or equal to that of the collector current, whereas in the subsequent conduction step, the base current must be equal to the collector current over the gain of the device itself.

It has already been said that embodiments of the proposed invention relate to applications wherein the collector current values are highly variable (for example, from 0 A to 25 A). Examples of such applications are:

high power suppliers with variable loads circuits for the correction of the power factor Therefore, for a correct operation of the high voltage power device BJT, the previously exposed driving conditions on the base current must be respected for each value of the collector current.

It has been considered suitable to choose an Rb=100 mΩ to minimize the dissipations due to the base driving and CB=3.3 μF so that the peak of the base current during the turn-on has a duration lower than 2 μs.

At this point, for obtaining a $V_b$ value which varies when the collector current varies starting from a constant voltage $V_b'$, the bipolar transistor PNP of FIGS. 5 and 6 has been inserted which has the task of performing a series regulation.

Making the base current outputting from the PNP vary it is possible to make the working point of the same transistor vary, i.e., its emitter current as well as the voltage drop between emitter and collector.

Let's now suppose to make the power device BJT H.V. work with a forced gain equal to five, so that the device reaches a good saturation level and a good strength to previously introduced tolerances and which will be deeply discussed hereafter. Thus:

$$I_{BHV}=I_{CPNP}=I_{CHV}/5$$

Considering that the lowest gain of a typical low voltage PNP device with nominal current of about 5 A is equal to 100, it must be:

$$I_{BPNP}=I_{CPNP}/100=I_{CHV}/500$$

In correspondence with the highest collector current equal to 25 A it must be:

$$I_{CQ1,max}=I_{BPNP,max}=I_{CHV,max}/500=25/500=50 \text{ mA}$$

Supposing that the value of the sensing resistance is equal to 13 mΩ, when the collector current of the BJT H.V. reaches its highest value, in the case at issue 25 A, the voltage drop on the sensing resistance is equal to 0.013*25=0.325 V.

Definitively, the condition $$I_{CQ1,max}/V_{Rs,MAX}=50 \text{ mA}/325 \text{ mV}$$

must be verified.

Figure 7:
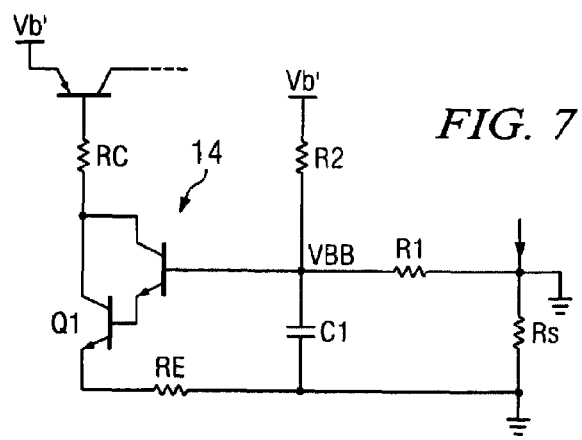
FIG. 7 shows a scheme of a transconductance stage.

FIG. 7 shows a part of the circuit proposed in the invention and precisely a transconductance amplifier stage 14, whose function is that of converting the input voltage $V_{Rs}$ into the output current $I_{CQ1}$.

Figure 8:
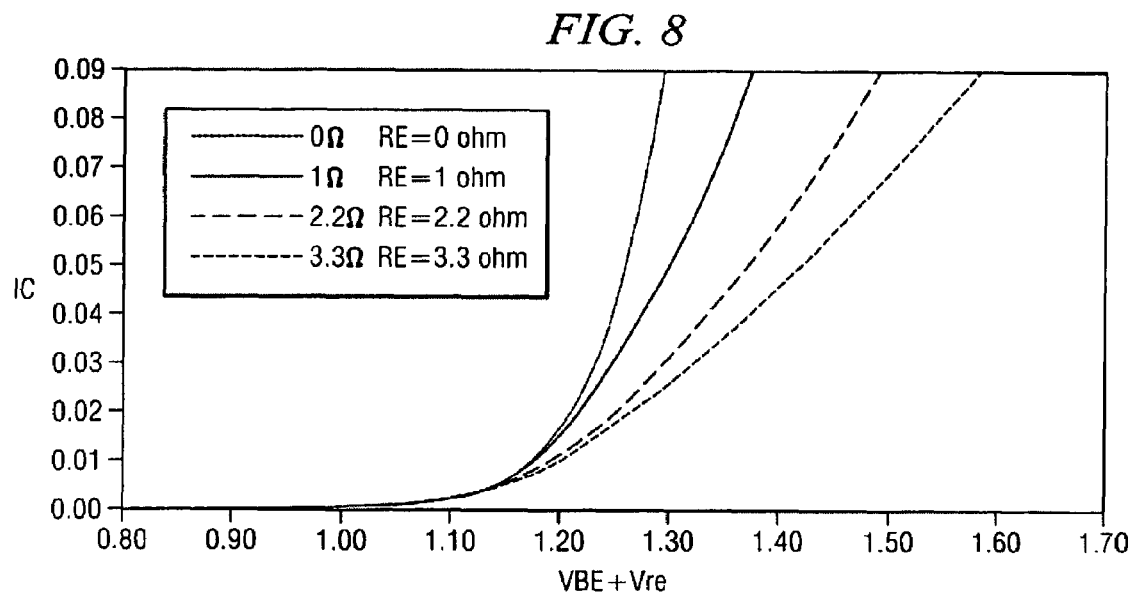
FIG. 8 shows a diagram with current-voltage characteristics of Q1 when RE varies.

It has already been seen that the highest drop on RS can reach a value equal to 0.325 V, taking now into consideration the characteristics $I_C$-$(V_{BE}-V_{RE})$ shown in FIG. 8 relative to the DARLINGTON with the addition of the emitter resistance RE, it follows that the highest voltage drop on RS would not allow the biasing of the DARLINGTON itself in active area.

In this regard, the value of R1 and R2 is chosen so as to bias the DARLINGTON base around the value of the threshold voltage, in this case 1.1 V.

Supposing $V_b'$=4 V and $V_{Rs}$=0 V, we have:

$$V_{BB}=R_1/(R_1+R_2)*V_b'$$

whereby:

$$R_2/R_1=V_b'/V_{BB}-1=2.63$$

Once the value of R1 is set equal to 100 Ω there must be R2=263 Ω. The standard closest value is 270 Ω, thus we set R2=270 Ω.

It is to be observed that the voltage on Rs can be considered an ideal voltage generator whose voltage value linearly varies with the collector current of the BJT H.V. according to the relation 0.013*$I_{C,BJTHV}$. If $I_{C,BJTHV}$ is equal to zero then $V_{Rs}$ is zero.

Figure 9:
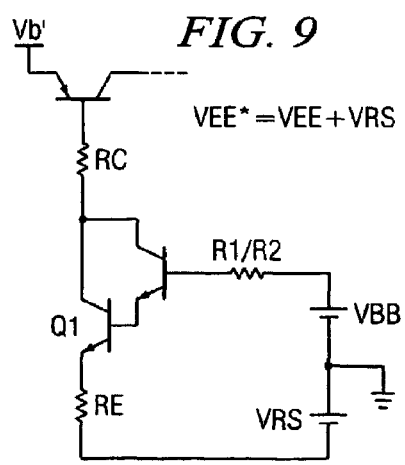
FIG. 9 shows a scheme of a Thevenin equivalent at the base node of Q1.
Figure 10:
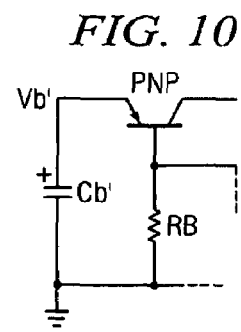
FIG. 10 shows a scheme of a voltage regulator stage.

Let's now consider the Thevenin equivalent circuit at the base node of Q1, as shown in FIG. 9. For the sake of simplicity from now on the capacitor C1 will be disregarded, whose task is simply that of filtering the signal coming from the sensing resistance so as to clean it of the very high frequency components.

Now $V_{BB}*=V_{BB}+V_{RS}$, then 1.1<$V_{BB}*$<1.425 and in correspondence with such range there must be 0<$I_{CQ1}$<50 mA. Let's consider the following relations:

$$V_{BB}*-V_{BE}(I_C)=R1//R2*I_B+R_E I_E$$

expressing $I_B$ according to $I_C$ and being $I_E \approx I_C$:

$$V_{BB}-*V_{BE}(I_C) \approx (R1//R2)/(hfe_{Q1})*I_C+R_E I_E \approx R_E I_C$$

and then:

$$I_C=(V_{BB}*-V_{BE}(I_C))/R_E$$

The relation between $I_C$ and $V_{BB}*$ is that shown in FIG. 8 being the voltage drop on R1//R2 negligible.

It is important to note that the current $I_C$ does not depend on the gain value of Q1.

The task of the emitter resistance is thus that of setting a feedback of the current-voltage type, i.e., the transconductance gain, which must not depend on the hfe spread of the device. In fact, the real hfe values of the devices have, as it has been said, a very wide natural distribution, and the circuit would require a dedicated sizing for each single transistor. By increasing the value of the emitter resistance the insensitivity of the circuit to the intrinsic gain variations of the device is increased, as previously said, moreover now how an increase of the emitter resistance allows to obtain a higher insensitivity when the working point varies will be shown.

The curves of FIG. 8 compare the input-output relations of the Darlington stage when the emitter resistance varies. It is to be noted that, in case the emitter resistance is not present, a strong variation of the current corresponds to a small variation of the voltage $V_{BB*}$ (obviously the threshold voltage being exceeded). With the insertion of the emitter resistance, and in particular when the value thereof grows, a possible variation of the voltage $V_{BE}$ reflects in a smaller and smaller variation of the collector current of the DARLINGTON $I_C$.

The biasing point can vary due to variations of the supply voltage $V_b{'}$ as well as due to possible variations of the $V_{BB*}$ of the DARLINGTON further to small process variations in the manufacturing of the small signal devices.

At this point it is obvious that if the dependence of the biasing point is to be minimized, the value of the emitter resistance is to be increased, but the increase of the emitter resistance brings to a reduction of the output dynamics, decreasing the value of the collector current according to $V_{BB*}$. Therefore, as it usually happens while designing, a compromise is to be established, which, in the specific case, is obtained with a resistance $R_E=3.3\Omega$.

With this value of $R_E$ a value of $I_C$ is obtained of about 50 mA in correspondence with the value $V_{BB*}=1.425$ V, as required by the designing conditions, and a sufficiently small dependence on the working point.

The collector resistance $R_C$ has the task of bearing the voltage difference between the base voltage of the transistor PNP and the collector voltage of the Darlington, and, without influencing the relation between the current $I_C$ and the voltage $V_{BB*}$, it must be chosen so as to maintain the transistor Q1 in the linear area. The chosen value is of $10\Omega$.

Finally, the resistance RB is used to ensure a minimum base current value, which allows the transistor PNP to remain on when the collector current of the BJT H.V. takes a low value. Under such conditions, in fact, the transistor Q1 is almost denied. In this way the presence of a base voltage is ensured, and thus of a current, for the BJT H.V. under each working condition.

So as to show the operation of the driving circuit 10 described up to now at best, the experimental results of the circuit of FIG. 6 are reported, where Vin=160 V and Vout=400 V.

By applying a duty-cycle equal to 80%, a sufficient number of pulses are input to make the collector current of the BJT H.V. reach a value of 25 A.

Figure 11:
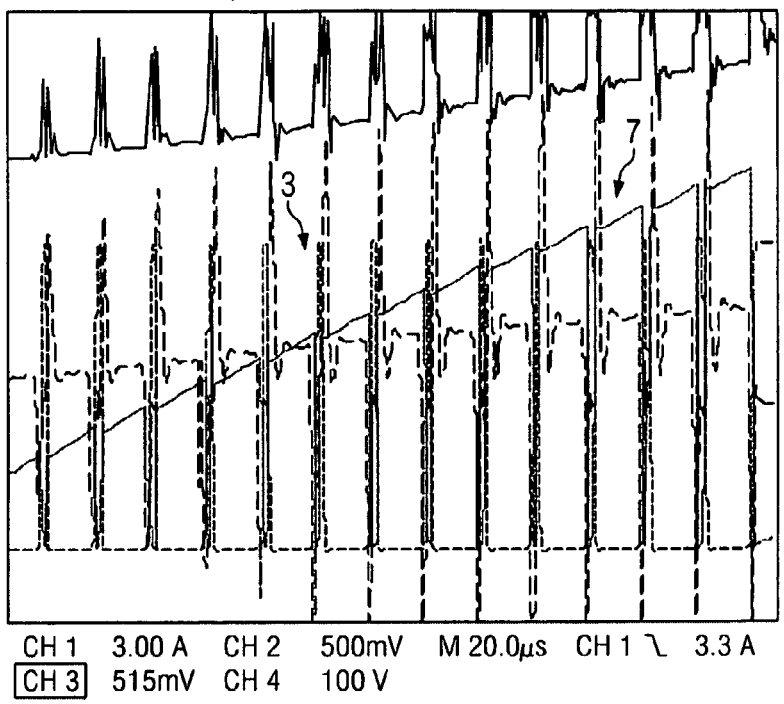
FIG. 11 shows a diagram with wave forms of the circuit with proportional base voltage and duty-cycle 80%.

In FIG. 11, the wave form indicated with 3, shows the trend of the current Ib when the collector current varies.

It is to be observed that the Ib follows, in a perfectly proportional way, the collector current both during the conduction time and during the turn-on peak.

The reading of the base current is performed by measuring the voltage across the base resistance $R_b$, and a scale of 515 mV/div corresponds to a scale of 5 A/div. As per what has been said, from FIG. 11 it is inferred that the base current in conduction takes a value being little higher than 1 A in correspondence with a collector current of about 5 A, and it reaches a value being little higher than 5 A in correspondence with a collector current of 25 A. In practice the proposed circuit performs such a regulation of the base current as to maintain an hfe equal to 5 for each value of the collector current.

With the wave form indicated with 7 the trend of the collector current on the transistor Q1 is shown through a voltage measure on the collector resistance, and since the value of such resistance is of ten, the scale of 500 mV/div corresponds to a scale of 50 mA/div, thus the collector current $I_{CQ1}$ takes an almost void value for a collector current $I_{C,BJTHV}$ of 5 A, and it reaches a value being higher than 50 mA in correspondence with a current of 25 A.

Figure 1:
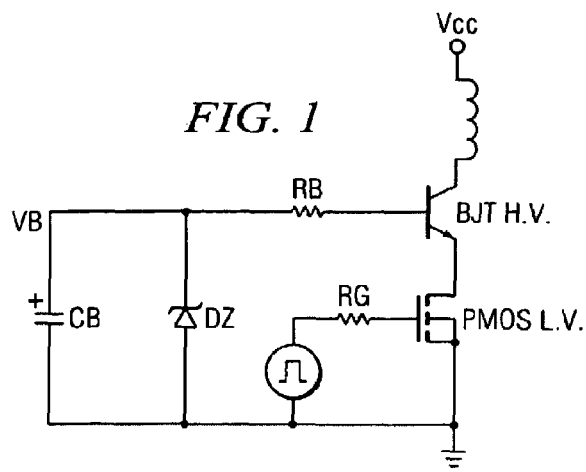
FIG. 1 shows a scheme of a driving circuit for emitter-switching known in the technique.
Figure 2:
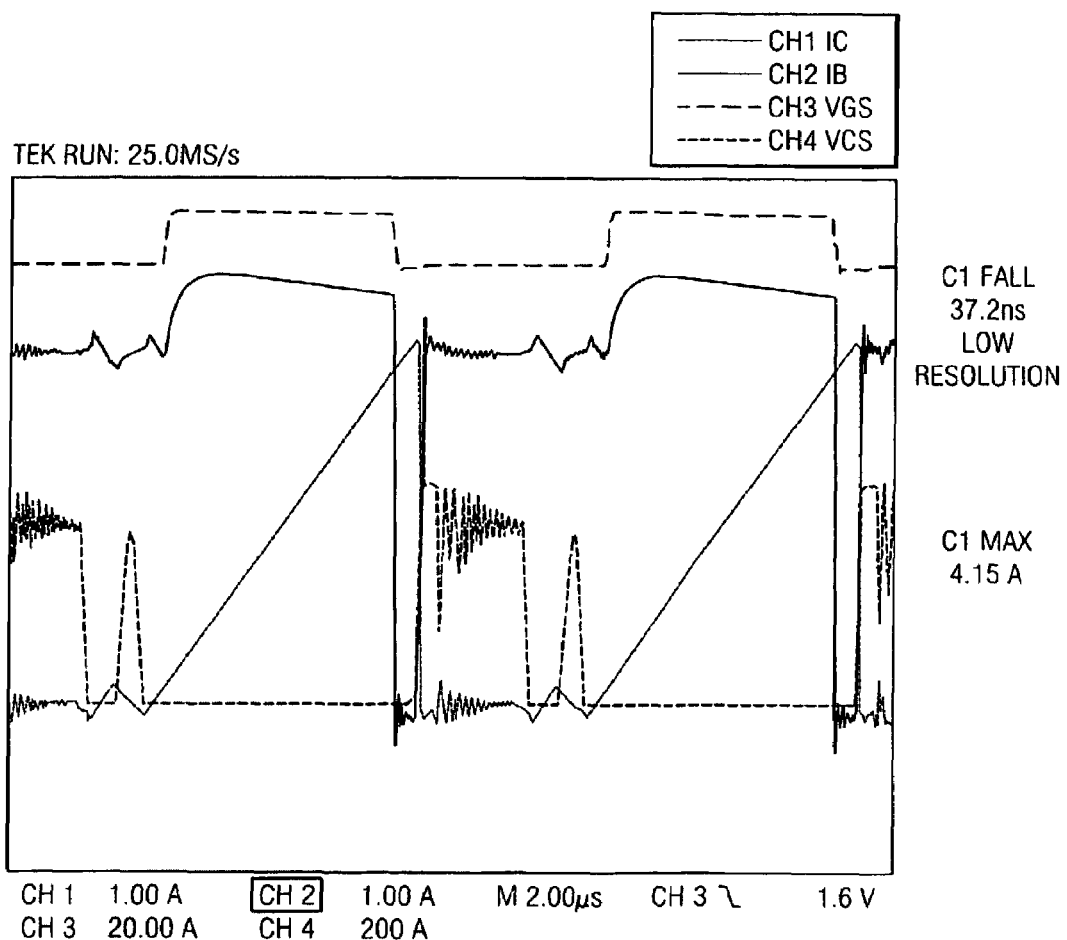
FIG. 2 shows a diagram with wave forms in a converter of the discontinuous fly-back type.
Figure 3:
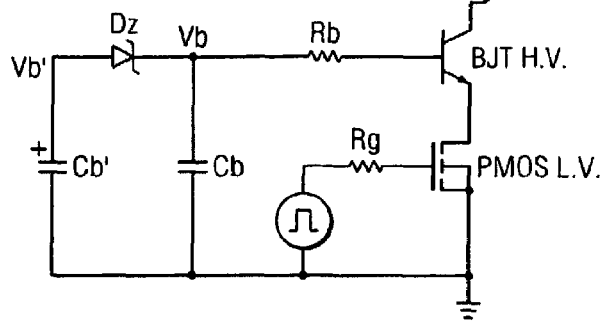
FIG. 3 shows a scheme of a driving circuit optimized for switch-on at non void current, which is also known in the technique.
Figure 12:
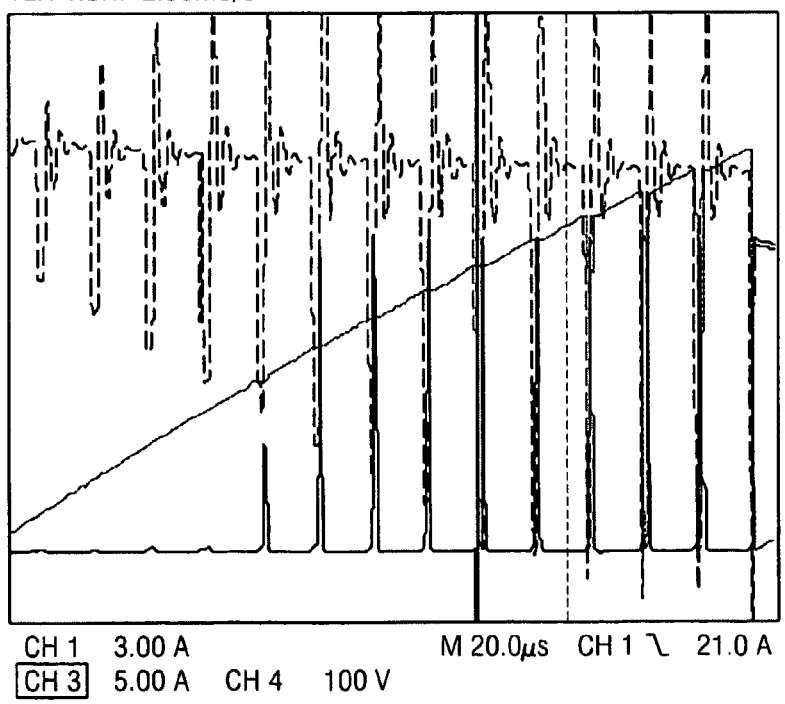
FIG. 12 shows a diagram with wave forms of the circuit with constant base voltage and duty-cycle 80%.

Before showing in detail the switching steps of the cascode configuration, highlighting the storage time, FIG. 12 shows the operation of the same circuit with base driving having constant voltage, as in FIG. 3.

It is to be noted that the value of the base voltage $V_b{'}$ which is applied by means of a voltage generator is of 3.1 V. Such value has been chosen so that in the most stressful situation, i.e., in correspondence with the highest value of the collector current, the transistor does not desaturate. In particular the value of $V_b$ has been chosen so that, at the highest working current, the storage time is equal to that obtained with the circuit proposed in the invention.

In FIG. 12 it can be noted that the base current has a decreasing trend when the collector current grows, i.e., a trend contrary to the desired on. This is justified by the fact that as the collector current grows, the voltage $V_{DSON}$ across the Power PMOS grows, and being the $V_{BEON}$ of the bipolar BJT H.V. almost constant and the $V_b$ constant, the voltage drop on the base resistance of the BJT H.V. it reduces of a value equal to the increase of $V_{DSON}$.

The highest base current value, with respect to the circuit with proportional network, brings the transistor BJT H.V. to an over-saturation working condition, with low and mean collector current provoking a very high storage time which delays the turn-off of the device with respect to the control signal.

This delay, with low current values, is long enough not to allow the turn-off of the device. In fact, by using a duty-cycle of 80%, and a switching frequency of 70 KHz, the Toff is of only 2.8 µs, which is lower than Tstorage for low current values.

A consequence of the excessive storage time for low current values is that even if the control signal imposes the switch-off of the device, the transistor actually remains on, and for intermediate current values the duty-cycle will be much longer than that imposed by the controller.

It is thus evident that the proportional network allows the controller to work in the best way, as it will be better seen below.

What has been already explained with the first wave forms, which show the operation of the circuit referred to more pulses, will be now deeply investigated showing the details of the switches for three current values, low, mean and high. Moreover, to highlight the variation of the Tstorage in case of driving with con constant voltage, the duty-cycle is reduced to 70%, so as to allow the turn-off of the device at the low currents and to measure the Tstorage under these conditions.

Figure 13:
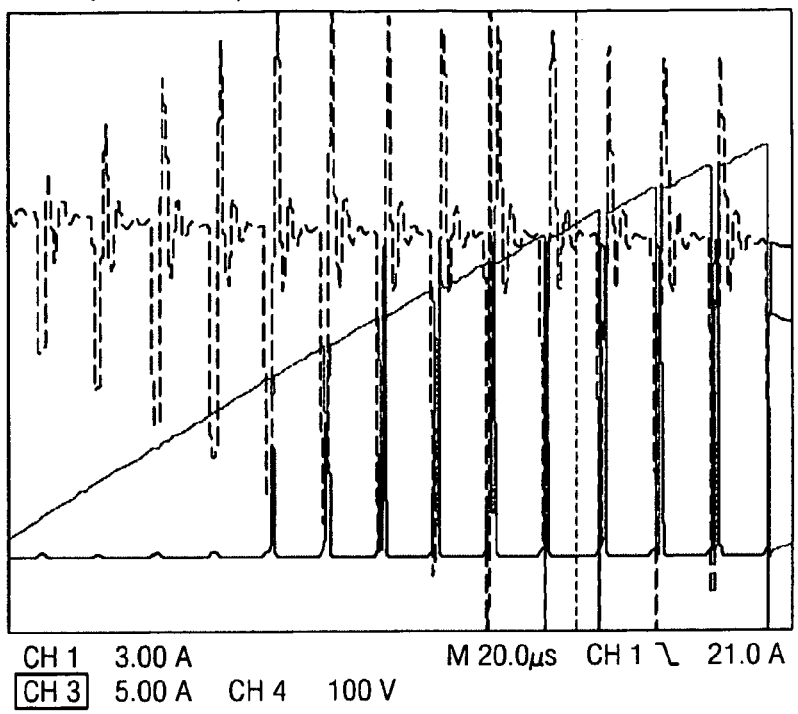
FIG. 13 shows a diagram with wave forms of the circuit with constant base voltage and duty-cycle 70%.

FIG. 13 shows the wave forms with duty-cycle 70%, where for very low current values some switches are still missing.

Figure 14:
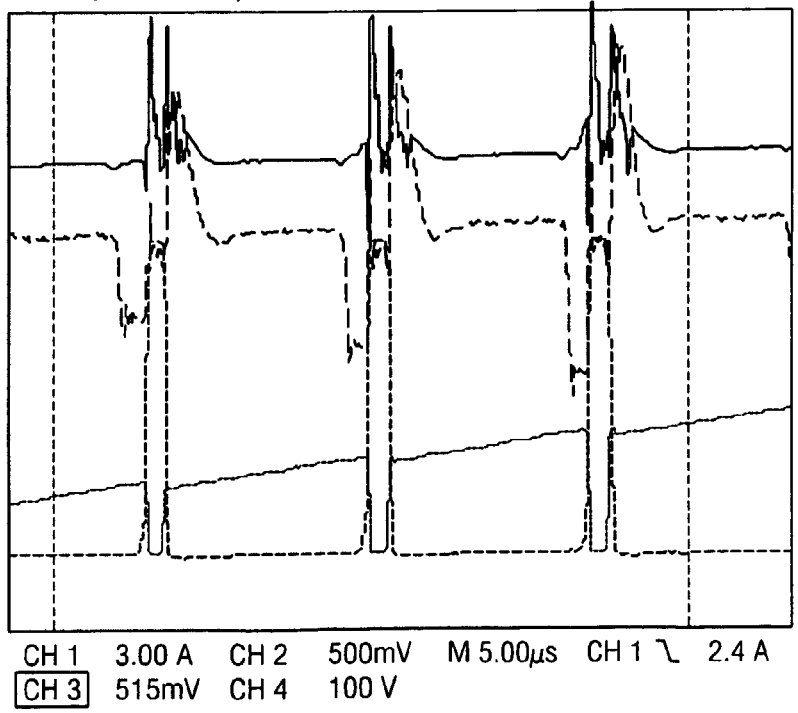
FIG. 14 shows a diagram with most detailed wave forms of the circuit with low current value having proportional driving and duty-cycle 80%.
Figure 15:
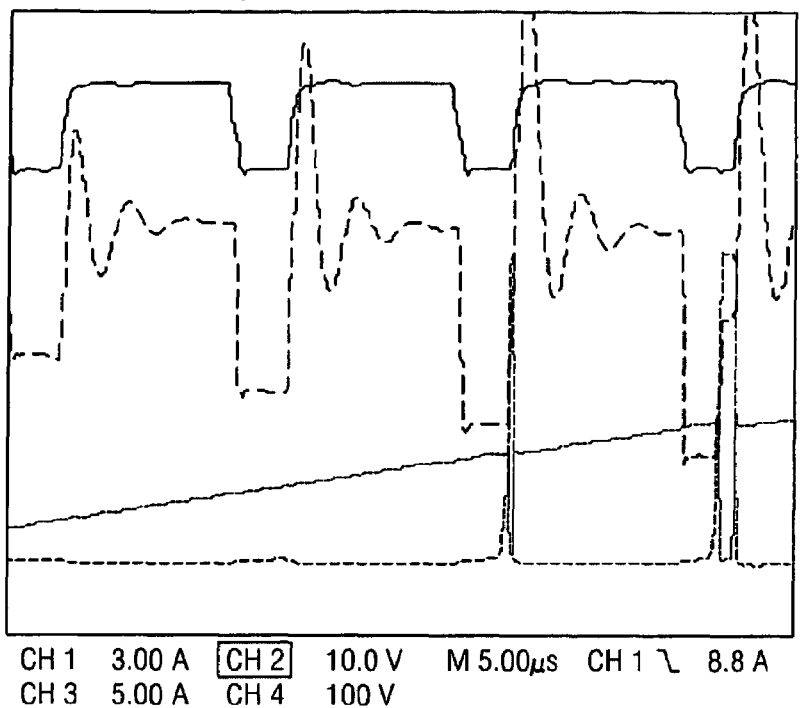
FIG. 15 shows a diagram with most detailed wave forms of the circuit with low current value having constant driving and duty-cycle 70%.

FIGS. 14 and 15 show a detail referred to only three pulses respectively with the driving circuit proposed in the invention and with the circuit of FIG. 3.

Figure 16:
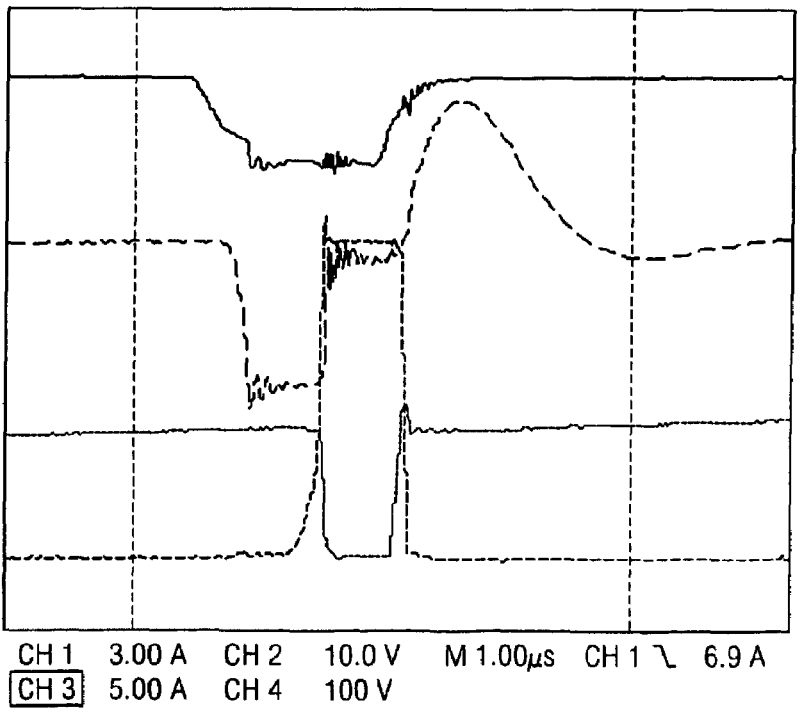
FIG. 16 shows a diagram with storage times for a switching with low current value and proportional driving.

FIG. 16 shows the detail of a turn-off with low current value with the circuit of the invention wherefrom it can be observed that the Tstorage is of about 1.1 μs. Such value, as it will be hereafter seen, will be kept almost unvaried when he working conditions vary.

Figure 17:
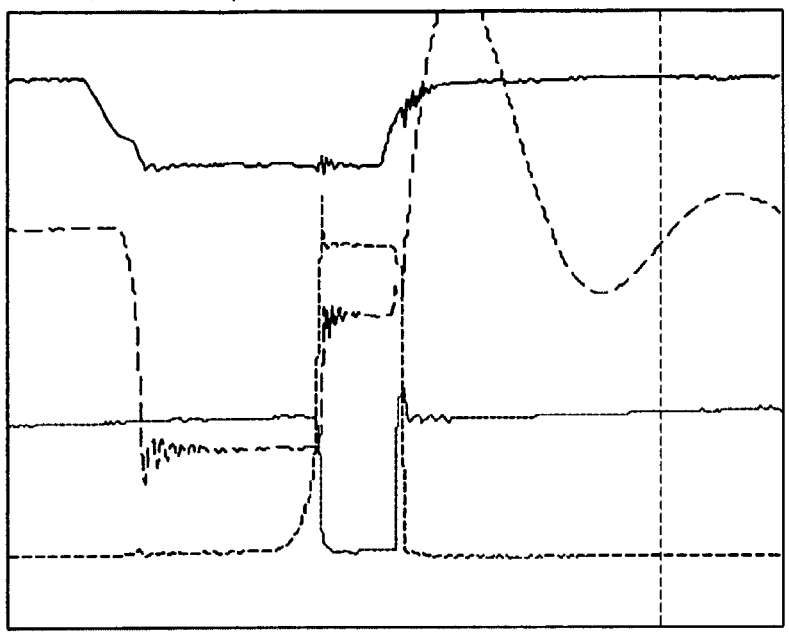
FIG. 17 shows a diagram with storage times for a switching with low current value and constant driving.
Figure 18:
FIG. 18 shows a diagram with most detailed wave forms of the circuit with mean current value having proportional driving and duty-cycle 80%.
Figure 19:
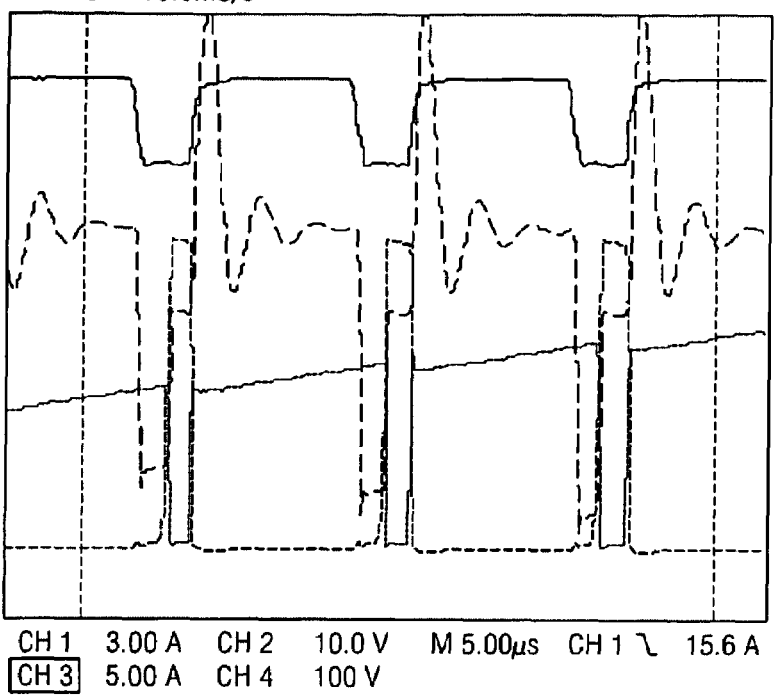
FIG. 19 shows a diagram with most detailed wave forms of the circuit with mean current value having constant driving and duty-cycle 70%.

FIG. 17, shows the detail of the turn-off with the same collector current value but with traditional driving. In this case the storage time is of about 2.3 μs.

Moreover it is to be noted that for collector currents being lower than those shown in FIG. 16, since no switches are present, the storage time of the proportional network will be surely higher than the value of Toff, which in the case of duty-cycle of 70% is of 4.2 μs.

Figure 20:
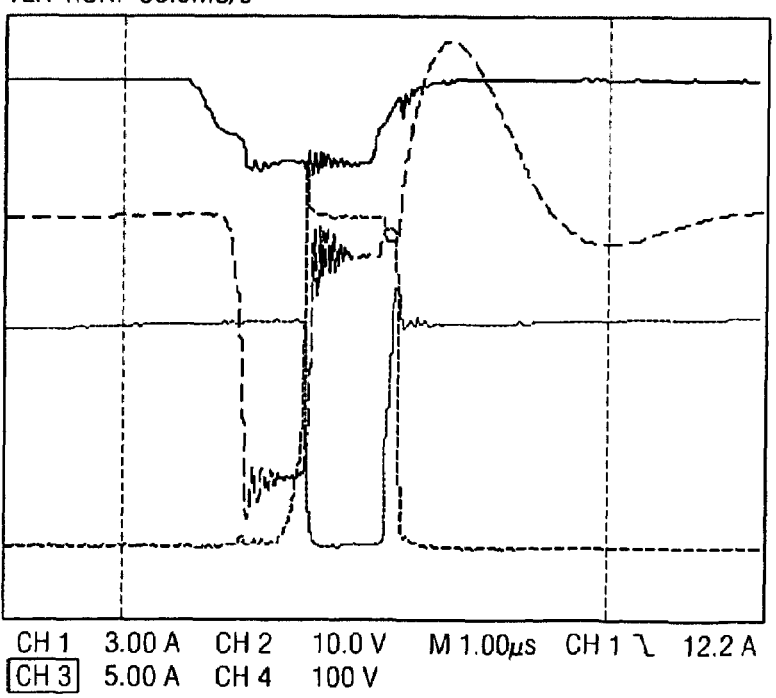
FIG. 20 shows a diagram with storage times for a switching with mean current value and proportional driving.
Figure 21:
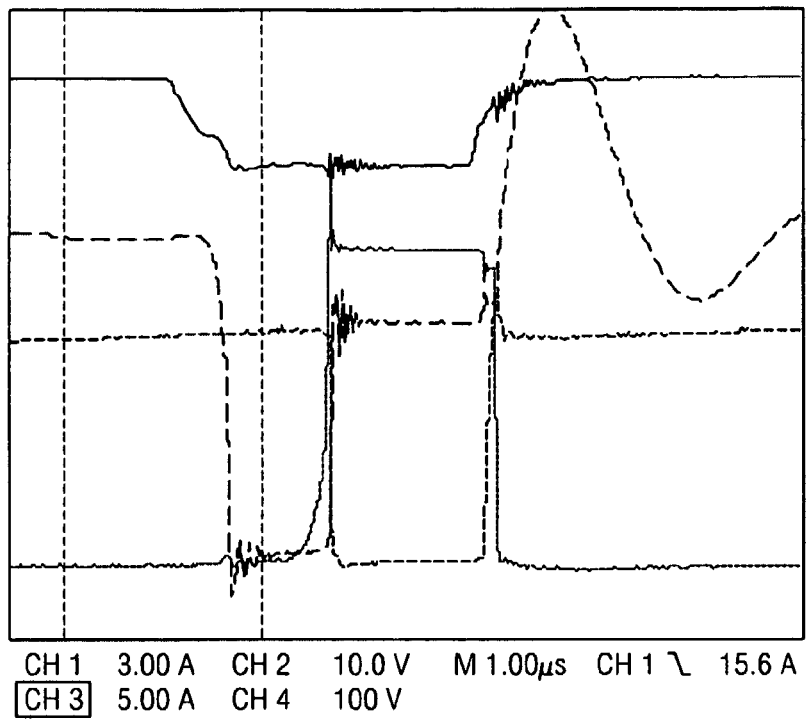
FIG. 21 shows a diagram with storage times for a switching with mean current value and constant driving.
Figure 22:
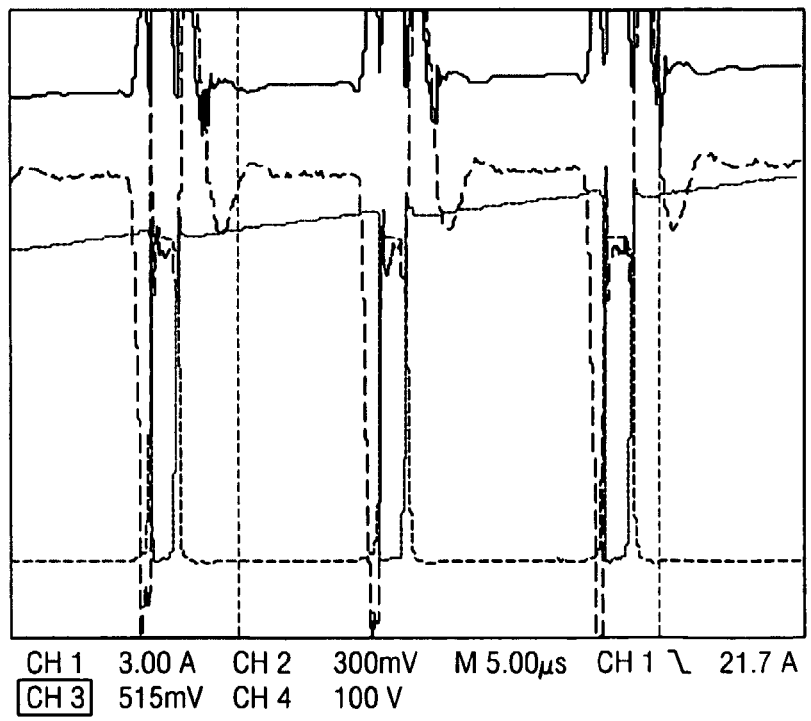
FIG. 22 shows a diagram with most detailed wave forms of the circuit with high current value having proportional driving and duty-cycle 80%.
Figure 23:
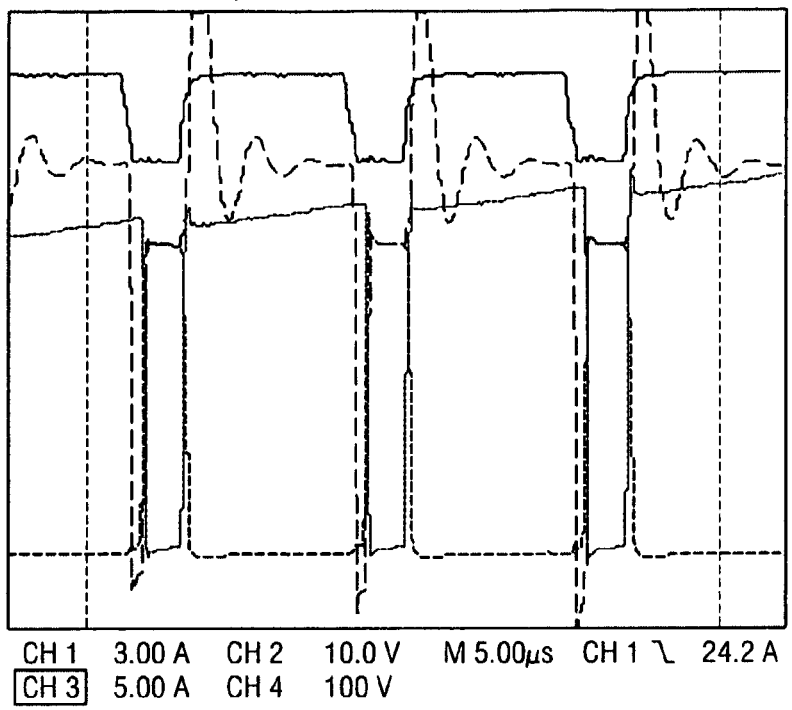
FIG. 23 shows a diagram with most detailed wave forms of the circuit with high current value having constant driving and duty-cycle 70%.

From the wave forms of FIGS. 20 and 21, it is seen how, being a value of the collector current of about 15A, the storage time is still of about 1 μs for the network with proportional driving, instead, for the network with constant driving the storage time is of about 1.4 μs.

Finally, in case of high collector current, and as shown in FIGS. 24 and 25, both networks reach the same value as the storage time which is just a little lower than 1 μs. This condition has been imposed so as to compare the two driving networks.

The up to now exposed results thus show that the proposed driving network allows the correct operation of the emitter switching configuration in all the applications for which the invention has been devised.

In the following table the exposed results are summarized, comparing the storage times when the current of the collector BJT H.V. varies.

| Type of Driving | Storage time | | | |
|---|---|---|---|---|
| | $I_{C,BJTHV} < 7A$ | $I_{C,BJTHV} \approx 8A$ | $I_{C,BJTHV} \approx 15A$ | $I_{C,BJTHV} \approx 25A$ |
| Driving according to the invention | <2 μs | 1.1 μs | 1 μs | 0.8 μs |
| Traditional driving | >4.2 μs | 2.3 μs | 1.4 μs | 0.8 μs |

The circuit according to the invention solves the technical problem and attains several advantages hereafter reported.

First of all the base current of the power transistor depends in conduction on the value of the voltage $V_{BB*}$ applied to the control terminal of such transistor, i.e., on the base current which is made proportional to the collector current by modulating the width of the voltage $V_{BB*}$ according to the collector current.

Hereafter are the condition where under the circuit is particularly efficient:
highly variable duty cycle (0<D<95%)
collector current comprised in a very wide range (0<$I_C$<25 A)
frequency higher than 30 kHz.

Obviously, a technician of the field, in order to satisfy specific, contingent needs, will be allowed to bring several modifications to the driving circuit of an emitter switching configuration according to the invention, all within the scope of protection of the present invention.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A circuit comprising:
an emitter switching configuration of transistors comprising a cascode connection of a power bipolar transistor and a power MOS transistor; and
a driving circuit for the emitter switching configuration which operates to control a saturation level of the emitter switching configuration in applications which provide a highly variable current to the collector of the transistor, comprising:
a circuit mesh to transfer a predetermined voltage value, derived from a level translated supply voltage reference, to a control terminal of said power bipolar transistor, the circuit mesh including a controllable active element; and
a current/voltage converter coupled to the power MOS transistor to sense collector current of the power bipolar transistor device and supply a control voltage to a control terminal of a first bipolar transistor coupled to the controllable active element of said circuit mesh so as to control variation of said predetermined voltage value in proportion to the collector current of the power bipolar transistor device.

2. The circuit according to claim 1, wherein said current/voltage converter is a sensing resistance connected in series to said power MOS transistor.

3. The circuit according to claim 1, wherein said element of said circuit mesh is a second bipolar transistor normally kept on by a base resistance connected to a voltage reference.

4. The circuit according to claim 1, further comprises a low-pass filter comprising: a pair of resistances and a capacitor between said current/voltage converter and said first bipolar transistor.

5. The circuit according to claim 4, wherein the resistances of said pair are biasing resistances for the first bipolar transistor.

6. The circuit according to claim 1, wherein said first bipolar transistor is a pair of transistors in Darlington configuration connected to an emitter resistance which is connected to a potential reference.

7. The circuit according to claim 6, wherein the value of said emitter resistance is equal to about 3.3Ω.

8. The circuit according to claim 6, wherein said emitter resistance provides a feedback of the current/voltage type having a transconductance gain independent from an hfe spread of the power bipolar transistor device.

9. The circuit according to claim 6, wherein the first bipolar transistor is coupled to said controllable active element of said circuit mesh through a collector resistance.

10. The circuit according to claim 9, wherein said collector resistance maintains a voltage difference between a base voltage of a second bipolar transistor comprising said controllable active element of the mesh and a collector voltage of the first bipolar transistor to maintain the first bipolar transistor in a linear operation area.

11. The circuit according to claim 10, wherein the value of said collector resistance is equal to about 10 Ω.

12. A circuit, comprising:
a bipolar transistor having a base terminal receiving a control voltage;
a power MOS transistor connected to the bipolar transistor in cascode to define a conduction path through the bipolar transistor and power MOS transistor;

a sensing circuit that senses a current flowing along the conduction path through the bipolar transistor and power MOS transistor; and a bias circuit coupled to the sensing circuit and operable to vary the control voltage of the bipolar transistor in proportion to the sensed conduction path current;

wherein the bias circuit comprises:

a first transistor having a conduction path coupled in series between a first reference voltage and the base terminal of the bipolar transistor; and a second transistor having a conduction path coupled in series between a control terminal of the first transistor and a second reference voltage, the second transistor having a control terminal coupled to receive a voltage indicative of the sensed conduction path current.

13. The circuit of claim 12 wherein the sensing circuit is a current-to-voltage converter outputting a voltage proportional to the conduction path current, the bias circuit operating responsive to the voltage to vary the control voltage in proportion thereto.

14. The circuit of claim 12 further including an inductor coupled in series with the conduction path.

15. The circuit of claim 12 wherein the bias circuit further includes a circuit for biasing the control terminal of the first transistor independent of the second transistor series conduction path coupling.

16. The circuit of claim 12 wherein the bias circuit further includes a circuit for biasing the control terminal of the second transistor independent of the voltage indicative of the sensed conduction path current.

17. The circuit of claim 12 wherein the conduction path of the first transistor is coupled in series between the first reference voltage and the base terminal of the bipolar transistor through a blocking diode.

18. The circuit of claim 17 wherein the bias circuit further includes a first capacitor for storing the varying control voltage.

19. The circuit of claim 18 wherein the bias circuit further includes a second capacitor for storing the first reference voltage.

20. The circuit of claim 12 wherein the second transistor comprises a Darlington pair of transistors.

21. A circuit, comprising:

a bipolar transistor having a base terminal receiving a control voltage;

a power MOS transistor connected to the bipolar transistor in cascode;

a current-to-voltage converter outputting a voltage proportional to a current flowing in a conduction path of the bipolar transistor; and a bias circuit comprising:

a first transistor having a conduction path coupled in series between a reference voltage and the base terminal of the bipolar transistor so as to vary the control voltage; and a second transistor having a conduction path coupled in series between a control terminal of the first transistor and a reference voltage, the second transistor having a control terminal coupled to receive the sensed proportional voltage and control first transistor varying of the control voltage in proportion to the sensed proportional voltage.

22. The circuit of claim 21 further including an inductor coupled in series with the conduction path and a capacitor coupled in a circuit between a terminal of the inductor and a reference voltage.

23. The circuit of claim 21 wherein the bias circuit further includes a circuit for biasing the control terminal of the first transistor independent of the second transistor series conduction path coupling.

24. The circuit of claim 21 wherein the bias circuit further includes a circuit for biasing the control terminal of the second transistor independent of the voltage indicative of the sensed conduction path current.

25. The circuit of claim 12 further including a filter for filtering a voltage indicative of the sensed current.

26. The circuit of claim 12 further including an inductor coupled in series with the conduction path and a capacitor coupled in a circuit between a terminal of the inductor and a reference voltage.

* * * * *

UNITED STATES PATENT AND TRADEMARK OFFICE
CERTIFICATE OF CORRECTION

| | | |
|---|---|---|
| PATENT NO. | : 7,449,935 B2 | Page 1 of 1 |
| APPLICATION NO. | : 11/066610 | |
| DATED | : November 11, 2008 | |
| INVENTOR(S) | : Rosario Scollo et al. | |

It is certified that error appears in the above-identified patent and that said Letters Patent is hereby corrected as shown below:

In the Specification:

At column 7, line number 10, please replace the words [to obtain] with the word -- obtaining --.

At column 9, line number 50, please replace the words [condition where under] with the words -- conditions whereunder --.

Signed and Sealed this
Ninth Day of August, 2011

David J. Kappos
*Director of the United States Patent and Trademark Office*

UNITED STATES PATENT AND TRADEMARK OFFICE
CERTIFICATE OF CORRECTION

PATENT NO. : 7,449,935 B2  Page 1 of 1
APPLICATION NO. : 11/066610
DATED : November 11, 2008
INVENTOR(S) : Rosario Scollo et al.

It is certified that error appears in the above-identified patent and that said Letters Patent is hereby corrected as shown below:

On the Title page of the patent:

Please insert section (30) as follows:

-- (30)     Foreign Application Priority Data
     Feb. 27, 2004   (IT) .............................................. MI2004A000356 --.

Signed and Sealed this
Fourth Day of October, 2011

David J. Kappos
*Director of the United States Patent and Trademark Office*